United States Patent [19]

Haubner et al.

[11] Patent Number: 5,079,672
[45] Date of Patent: Jan. 7, 1992

[54] ELECTRICAL SWITCHING AND CONTROL APPARATUS

[75] Inventors: Georg Haubner, Berg; Hartmut Zöbl, Fürth/Bay, both of Fed. Rep. of Germany

[73] Assignee: Robert Bosch GmbH, Stuttgart, Fed. Rep. of Germany

[21] Appl. No.: 427,859
[22] PCT Filed: Mar. 9, 1988
[86] PCT No.: PCT/DE88/00128
  § 371 Date: Oct. 13, 1989
  § 102(e) Date: Oct. 13, 1989
[87] PCT Pub. No.: WO88/09058
  PCT Pub. Date: Nov. 17, 1988

[30] Foreign Application Priority Data

May 14, 1987 [DE] Fed. Rep. of Germany ....... 3716102

[51] Int. Cl.$^5$ ................................................. H05K 7/20
[52] U.S. Cl. ...... 361/387; 165/185, 361/395, 439/485
[58] Field of Search ........................ 361/382, 386–389,
      361/395, 399, 400, 426; 165/80.3, 185; 357/81;
      439/76, 78, 83, 84, 485; 174/252, 52.2, 16.3

[56] References Cited

U.S. PATENT DOCUMENTS

| | | |
|---|---|---|
| 3,805,117 | 4/1974 | Hausman . |
| 4,039,900 | 8/1977 | Roback ................................ 361/388 |
| 4,060,847 | 11/1977 | Penrod ................................ 361/387 |
| 4,254,447 | 3/1981 | Griffis ................................. 361/389 |
| 4,409,641 | 10/1983 | Jacob .................................. 361/386 |
| 4,689,719 | 8/1987 | Prussas ............................... 361/388 |
| 4,803,590 | 2/1989 | Fassel ................................. 361/386 |

OTHER PUBLICATIONS

WO 87/01007, PCT/DE 86/00110, European patent, Reinhard Fassel, Robert Bosch GmbH 2/87.

Primary Examiner—Gerald P. Tolin
Attorney, Agent, or Firm—Michael J. Striker

[57] ABSTRACT

An electrical switching and control device comprising a plurality of heat-emitting electronic components arranged on a hybrid plate, and a plurality of plug-in contacts having surface areas contacting a surface area of the hybrid plate for dissipating heat from the electronic components, and end portions directly connected with connection elements of the hybrid plate.

7 Claims, 1 Drawing Sheet

ELECTRICAL SWITCHING AND CONTROL APPARATUS

BACKGROUND OF THE INVENTION

The invention relates to an electrical switching and control appartus comprising a plug-in contact strip. It is known to inject the plug pins of such switching and control devices in a plug-in base of insulating material and to make contact between the ends of the plug-in contacts located in the device housing and a printed circuit board. The printed circuit board carries one or more so-called hybrid plates with electronic circuit elements (DE-OS as disclosed in 28 06 558) and/or discrete power semiconductor components and the like.

In another construction known from WO 87/01 007 (R 20142), the power components are fastened, in addition, on a cooling plate which is supported on parallel areas of the adjacent plug-in contacts by an insulating foil and, in this way directs heat generated in the power components outward, via the plug-in contacts, to the electrical lines connected thereto. This construction is costly in production, since the printed circuit boards, the discrete components, and the cooling plate must be prefabricated and preassembled before they are inserted into the switching and control device and soldered with the connection contacts. Moreover, much space is required for such constructions, and they may not be exposed to great shock or vibration stresses when used in motor vehicles because of the relatively large dimensions of the printed circuit board.

In a switching and control device known from U.S. Pat. No. 3,805,117, hybrid plates make direct contact with the plug-in contacts of the device without the intermediary of printed circuit boards. Power semiconductor components in a discrete construction make contact with the hybrid plate which guide off their heat either via a solid enclosure or via another ceramic plate at a steel housing of the device. This construction is also costly, since it requires a metal housing for conducting the heat outward and in which special insulators are inserted for guiding through the plug-in contacts. Moreover, the steel housing is very heavy, which is very undesirable in a motor vehicle construction.

SUMMARY OF THE INVENTION

The object of the present invention is to construct an electrical switching and control device as inexpensively and compactly as possible in a hybrid circuit, wherein the power components are to be glued with the hybrid plate, likewise using hybrid technology, accompanied by sufficient dissipation of heat.

The object of the invention is achieved by providing a switching and control device in which the plug-in contacts have surface regions which contact the rear side of the hybrid plate, and are contacted at their ends by connection parts of the hybrid plate.

The switching and control device, according to the invention, has the advantage that additional parts are no longer required for conducting heat off from the power components. Both a cooling plate and a printed circuit board are dispensed with, so that the device can be produced compactly and with a small weight. Since the heat is directed outward into the connected cable harness via the plug-in contacts, the metal housing can also be replaced with a plastic housing which is substantially lighter and can be produced at less expense.

It is particularly advantageous to arrange the hybrid plate in the device so that it is resistant to shocks and vibrations. The hybrid plate is fastened on one of its longitudinal sides with the ends of the plug-in contacts via connection pins and is fixed at its other longitudinal side behind projection of a connection base which carries the plug-in contacts. Moreover, it is advisable that the hybrid plate rest on bent areas of the plug-in contacts with a surface-area contact. A reliable contact of the hybrid plate is achieved in that the ends of the plug-in contacts located in the housing are provided with crimping tongues and make contact with the connection pins of the hybrid plate or with connection wires of additional electronic components by crimping. The dissipation of heat can also be promoted in that the hybrid plate and the areas of the plug-in contacts contacting the hybrid plate are connected with one another via a heat conducting paste or a glue. In order for the arrangement of the hybrid plate to be tight against the penetration of dirt and moisture, it is advisable that the hybrid plate be arranged in a collar of the connection base and embedded in a sealing compound jointly with the ends of the plug-in contacts.

The present invention both as to its construction so to its method of operation, together with additional objects and advantages thereof, will be best understood from the following detailed description of specific embodiments when read in connection with the accompanying drawings.

BRIEF DESCIPTION OF THE DRAWINGS

Figure 3:
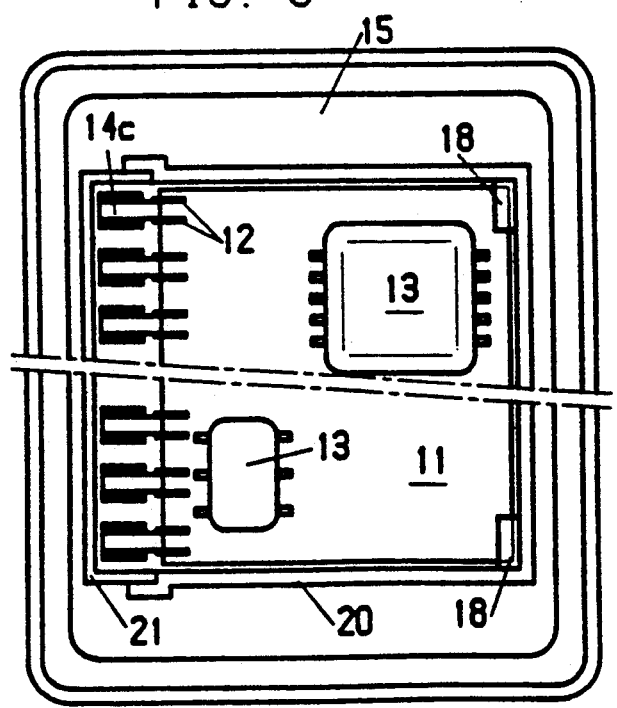
Figure 4:
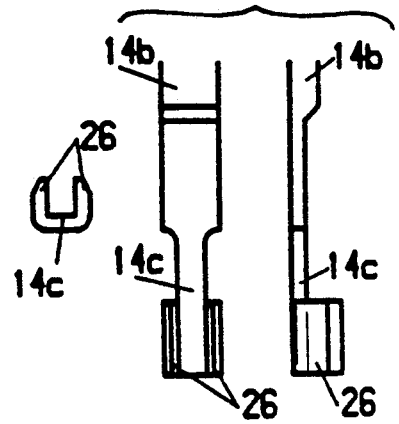

FIG. 3 a top view of a plug-in base of a further embodiment of the device according to the example with a hybrid plate on the rear side, the hybrid plate being arranged vertically with respect to the plug-in base; and FIG. 4 shows elevation side and end view of an end of a plug-in contact to be contacted with the connection pins of the hybrid plate.

DESCRIPTION OF THE PREFERRED EMBODIMENTS

Figure 1:
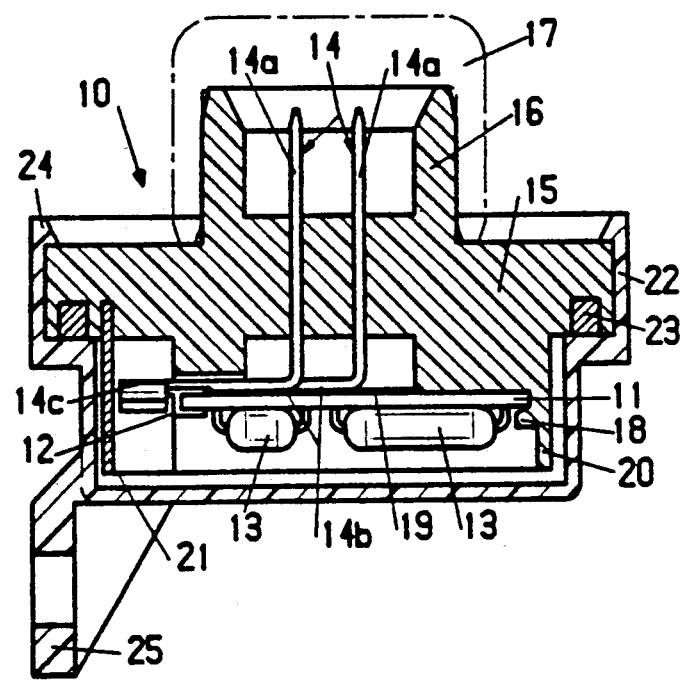
FIG. 1 shows a cross-sectional view of the first embodiment of an electrical switching and control device according to the present invention with a multiple-contact plug-in connection.
Figure 2:
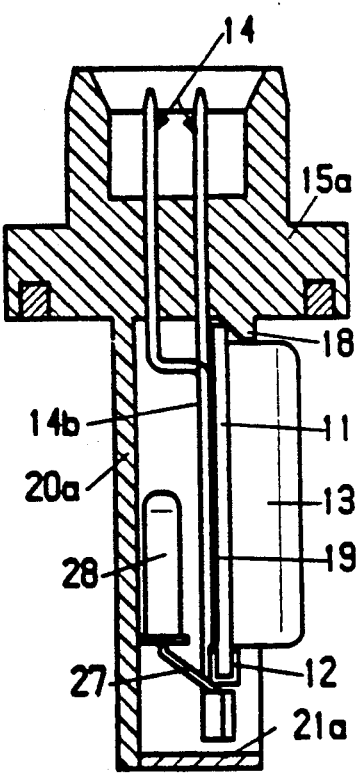
FIG. 2 shows a cross-sectional view of the plug-in base of the device shown in FIG. 1 with a view of the hybrid plate at the rear of the base.

FIG. 1 shows the cross section of an electronic switching and control device 10 for a motor vehicle, e.g. for the transmission control in motor vehicles. The electronic circuitry of the device 10 is connected on a ceramic plate 11 with conductor paths in a conventional manner using hybrid technology, the ceramic plate 11 carrying a row of connection pins 12 at its left-hand longitudinal edge as shown in FIG. 2. Further, power semiconductors 13 are glued on and bonded on the ceramic plate 11 using known hybrid technology. The electrical connection of the switching and control device 10 is effected via a plug-in contact strip consisting of a plurality of flat plug-in tongues 14 arranged adjacent to one another in two lines, one flat plug-in tongue of the lines which are arranged one above the other being shown in FIG. 1. The flat plug-in tongues 14 extend as plug-in contacts with their middle area 15a in a plug-in base 15 produced from a plastic material. The outwardly projecting ends of the plug-in tongues 14 are enclosed by a collar 16 of the plug-in base 15. As shown in dash-dot lines, a multiple-contact device plug 17 is placed on this collar 16; the lines of a connection cable, not shown, are connected at the multiple-contact device plug 17 and are connected with corresponding flat plug-in sleeves in the device plug 17 for producing a detachable plug-in connection with the switching and control device 10. The plug-in tongues 14 have a bent area 14b for surface-area contact with the rear side of the hybrid plate 11 at the back of the plug-in base 15 in order to dissipate heat. The plug-in tongues 14 have ends 14c connected with respective connection pins 12 of the hybrid plate 11 by crimping. The hybrid plate 11 is accordingly fastened at its left-hand longitudinal side, via the connection pins 12, with the ends 14c of the flat plug-in tongues 14. The hybrid plate 11 is fixed behind a plurality of projections 18 of the connection base 15 at its oppositely located, right-hand longitudinal side. Instead of the three projections 18 which can be seen in FIG. 2, there can also be a continuous projection in this location, behind which the hybrid plate 11 is inserted prior to making contact with the ends 14c of the flat plug-in tongue 14.

Since the hybrid plate 11 in this embodiment rests on the bent areas 14b of the flat plug-in tongues 14 along the surface area, the device 10 can be constructed so as to be very flat and compact. A good dissipation of the heat at the power semiconductors 13 on the hybrid plate 11 can be achieved in particular in that the hybrid plate 11 and the adjacent regions 14b of the flat plug-in tongues 14 are connected with one another via a heat conducting paste or a glue 19.

It can be seen from FIG. 2, in connection with FIG. 1, that the entire hybrid plate 11, including its connections at the ends 14c of the flat plug-in tongues 14, is enclosed by a collar 20 at the back of the plug-in base 15, wherein the collar is closed on the left-hand side in the area of the crimp connections by a frame 21 of a plastic material after the contacting of the hybrid plate 11 with the flat plug-in tongues 14 in order to embed the entire hybrid circuit in a watertight manner with a casting resin, silicon or another insulating sealing compound. The plug-in base 15 with the hybrid plate 11 is finally enclosed by an insulation housing 22 which can be welded on the plug-in base 15 by ultrasonics or can be placed on the plug-in base 15 with aid of a rubber seal 23, as shown in FIG. 1, and snapped on at its upper side by catch projections 24. In such a waterproof construction, the de-aeration can be effected via the plug-in base 15 and the device plug 17 with connected cable or via a pressure compensation element, not shown, which is to be inserted in the housing 22. A bracket 25 which is formed on at the insulation housing 22 serves for the fastening of the switching and control device 10. A metal housing, e.g. die cast aluminum or a sheet-metal housing, can also be used as housing, wherein the bracket 25 is welded on at the housing in the latter case.

In another embodiment in which the same reference numerals as in FIGS. 1 and 2 are used for the same parts, shown in FIG. 3, a plug-in base 15a with two rows of flat plug-in tongues 14 is arranged one above the other, with the hybrid plate 11 being at a distance vertically from the plug-in base 15a at the rear side of the latter. In this case also the hybrid plate 11 carries power semiconductor elements 13 which contact it along the surface area and whose heat losses are to be conducted off via the hybrid plate 11 to the plug-in contacts in the form of flat plug in tongues 14. For this purpose, the rear side of the hybrid plate 11 rests on the regions 14b of the adjacent flat plug-in tongues 14 along a surface area. Here, also, the heat transfer is further increased by the use of a heat conducting glue and a heat conducting paste between the hybrid plate 11 and the regions 14b of the flat plug-in tongues 14. The ends 14c of the flat plug-in tongues 14 located in the housing of the switching and control device, not shown, are also provided with crimp tongues 26 in this case, one of which can be seen in enlarged scale in FIG. 4 in different views. A connection pin 12 of the hybrid plate 11 or a connection wire 27 of another electronic component 28, e.g. an oscillating crystal, is connected with these crimp tongues 26 by crimping. This component 28 can be fastened by plastic springs, not shown, at the plug-in base and at the collar 20a, respectively, which encloses the hybrid plate 11 and is sealed in the area of the contact side of the hybrid plate 11 provided with the connection pin 12 by an insulation frame 21a for pouring sealing compound or the like.

In this case also, the hybrid plate 11 is clamped or glued directly on a plug strip, so that the large support surface of the hybrid plate 11 on the plug regions 14b ensures that the heat is directed out toward the cable harness in a favorable manner. The connection pins 12 of the hybrid plate 11 are assigned directly to a flat plug 14. Power semiconductor switches can be applied directly to the hybrid plate 11 without special cooling plates because of the favorable dissipation of heat. In another construction of the plug-in contacts and the contacts at the hybrid plate 11, an electrical connection can also be effected by dip soldering, manual soldering, welding and the like, instead of crimping connections between the hybrid plate 11 and the flat plug-in tongues 14.

While the invention has been illustrated and described as embodied in a switching and control device, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims:

1. An electrical switching and control device comprising a housing; a plurality of plug-in contacts at least partially located in said housing and arranged adjacent to each other; means for supporting said plug-in contacts in said housing; a hybrid plate having opposite longitudinal sides, front and rear surfaces and a plurality of connection elements mounted on one of said opposite longitudinal sides and extending onto said rear surface and at least one heat-emitting electronic power component fastened on said hybrid plate, each of said plug-in contacts having a surface area located in said housing and contacting said hybrid plate only on one of said surfaces for dissipating heat from said at least one electronic power component, and each of said plug-in contacts having an end portion directly connected with a respective one of said plurality of connection elements, said at least one electronic power component being fastened on said front surface and said surface areas of said plug-in contacts contacting said rear surface of said hybrid plate.

2. An electrical switching and control device as set forth in claim 1, wherein said hybrid plate is made of a ceramic material.

3. An electrical switching and control device as set forth in claim 1; wherein said supporting means includes a connection base supporting said plug-in contacts and having projection means, the other of said opposite longitudinal sides of said hybrid plate being fixed behind said projection means.

4. An electrical switching and control device as set forth in claim 1, wherein said plug-in contacts have longer portions and shorter portions extending transverse to said longer portions and said shorter portions defining said contacting surface areas, said hybrid plate resting on said contacting surface areas.

5. An electrical switching and control device as set forth in claim 1, further comprising additional electronic components having connection wires, said end portions of said plug-in contacts comprising crimping tongues connected with respective connection elements of said hybrid plate and respective wires by crimping.

6. An electrical switching and control device as set forth in claim 1, wherein said contacting surface areas of said plug-in contacts are connected with said hybrid plate by one of heat-conducting paste and heat-conducting glue.

7. An electrical switching and control device as set forth in claim 1, including a connection base in said housing which includes a collar, said hybrid plate being arranged within said collar and being embedded together with said end portions of said plug-in contacts in a sealing compound.

* * * * *